(12) United States Patent
Takekida

(10) Patent No.: US 11,386,959 B2
(45) Date of Patent: Jul. 12, 2022

(54) SEMICONDUCTOR STORAGE DEVICE

(71) Applicant: KIOXIA CORPORATION, Tokyo (JP)

(72) Inventor: Hideto Takekida, Nagoya Aichi (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/191,563

(22) Filed: Mar. 3, 2021

(65) Prior Publication Data

US 2022/0068389 A1    Mar. 3, 2022

(30) Foreign Application Priority Data

Sep. 2, 2020    (JP) .............................. JP2020-147663

(51) Int. Cl.
| | | |
|---|---|---|
| *G11C 16/04* | (2006.01) | |
| *G11C 16/08* | (2006.01) | |
| *G11C 16/24* | (2006.01) | |
| *H01L 27/11556* | (2017.01) | |
| *G11C 16/16* | (2006.01) | |
| *G11C 16/26* | (2006.01) | |

(52) U.S. Cl.
CPC .......... *G11C 16/0483* (2013.01); *G11C 16/08* (2013.01); *G11C 16/16* (2013.01); *G11C 16/24* (2013.01); *H01L 27/11556* (2013.01); *G11C 16/26* (2013.01)

(58) Field of Classification Search
CPC ...................................................... G11C 16/04
USPC ...................................................... 365/185.01
See application file for complete search history.

(56) References Cited

U.S. PATENT DOCUMENTS 10,566,059 B2    2/2020   Diep et al.
2020/0043549 A1*  2/2020   Shibata .............. G11C 16/0483

* cited by examiner

*Primary Examiner* — Jason Lappas
(74) *Attorney, Agent, or Firm* — Kim & Stewart LLP

(57) ABSTRACT

A semiconductor storage device includes a memory string and a row decoder configured to apply voltages to first to fourth select gate lines and first and second word lines connected to the memory string. A sequencer has first mode for erasing the entire memory string and a second mode for erasing just a portion of the memory string. In the first mode, a first voltage is applied to the bit line and the source line, a second voltage lower than the first voltage is applied to the first select gate line, a third voltage is applied to the second select gate line, a fourth voltage is applied to the third select gate line, a fifth voltage lower than the first voltage is applied to the fourth select gate line, and a sixth voltage lower than the first to fifth voltages is applied to the first and second word lines.

20 Claims, 7 Drawing Sheets

SEMICONDUCTOR STORAGE DEVICE

CROSS-REFERENCE TO RELATED APPLICATION

This application is based upon and claims the benefit of priority from Japanese Patent Application No. 2020-147663, filed on Sep. 2, 2020, the entire contents of which are incorporated herein by reference.

FIELD

Embodiments described herein relate generally to a semiconductor storage device.

BACKGROUND

A NAND flash memory is a known semiconductor storage device. There is a need for such a semiconductor storage device to have an improved processing capacity.

DETAILED DESCRIPTION

Figure 1:
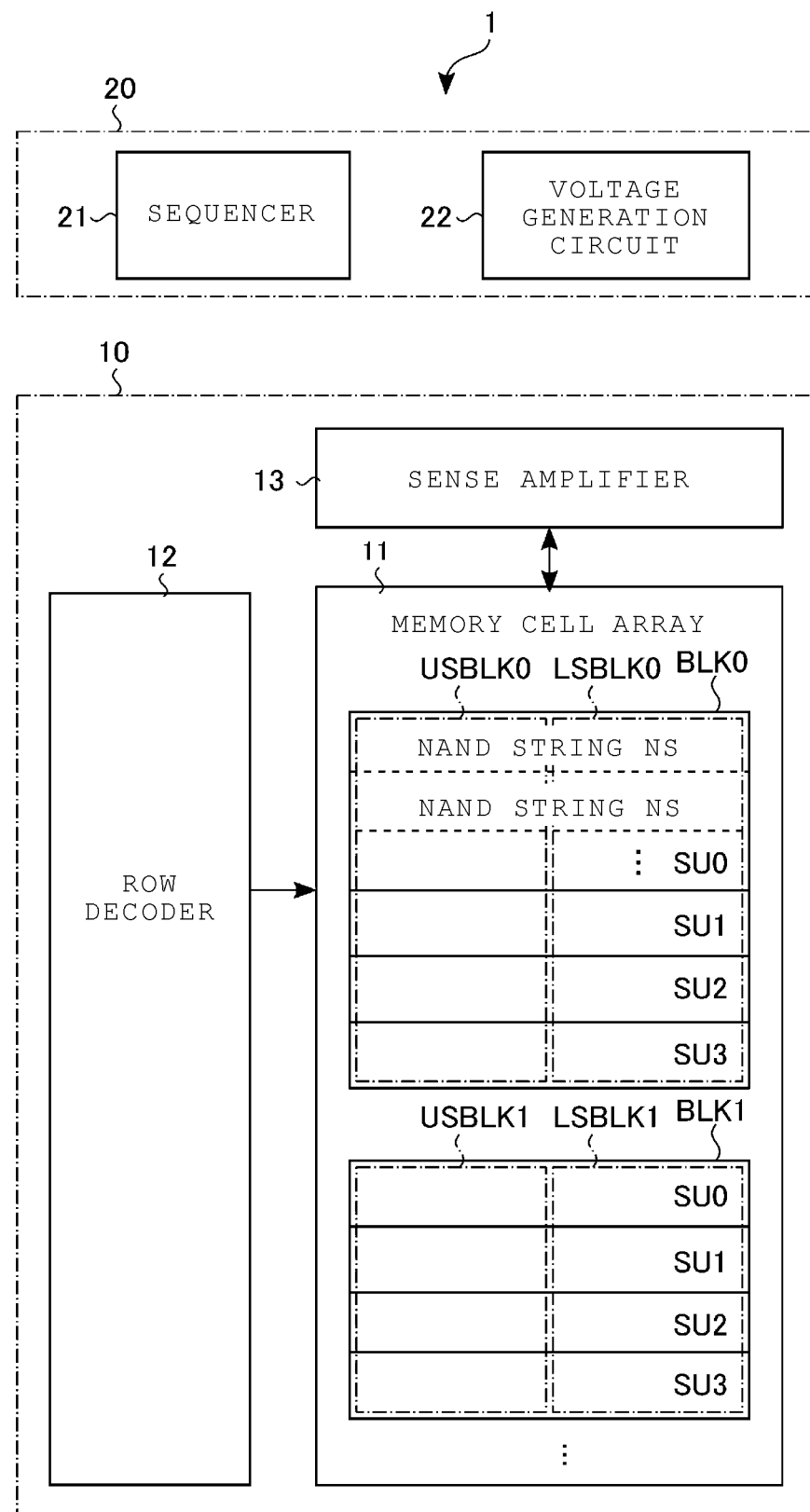
FIG. 1 is a block diagram of a semiconductor storage device according to an embodiment.

In general, according to one embodiment, a semiconductor storage device includes a memory string with first to fourth select transistors and first and second memory cells connected in series with each other in the following order: the first select transistor, the second select transistor, the first memory cell, the second memory cell, the third select transistor, and the fourth select transistor. There are first to fourth select gate lines connected to gates of the first to fourth select transistors, respectively. A first word line and a second word line connected to gates of the first and second memory cells, respectively. A bit line is connected to the first select transistor. A source line is connected to the fourth select transistor. A row decoder is configured to apply voltages to the first to fourth select gate lines and the first and second word lines. A data erase operation has a first mode for erasing first data in the first and second memory cells and a second mode for erasing second data in the first and second memory cells. In the first mode, a first voltage is applied to the bit line and the source line, a second voltage, lower than the first voltage, is applied to the first select gate line, a third voltage is applied to the second select gate line, a fourth voltage is applied to the third select gate line, a fifth voltage lower than the first voltage is applied to the fourth select gate line, and a sixth voltage lower than the first to fifth voltages is applied to each of the first and second word lines.

Hereinafter, some example embodiments of a semiconductor storage device will be described with reference to the accompanying drawings. It is noted that, in the following description, components having substantially the same function and configuration are designated by the same reference numerals, and duplicate explanations will be made only as necessary. In addition, each of the embodiments illustrated below is only one example of a device or method embodying the technical concepts of the present disclosure, such the technical concepts are not limited to the specific example materials, shapes, structures, arrangement, and the like of the components utilized in the example embodiments unless otherwise noted. In general, the technical concepts explained in conjunction with the embodiments may be modified into various other forms within the scope of the present disclosure.

Examples of the semiconductor storage device include, but are not limited to, a three-dimensional stacked NAND flash memory in which memory cell transistors are three-dimensionally stacked on a semiconductor substrate.

1. Configuration

1.1 Overall Configuration of Semiconductor Storage Device

FIG. 1 is a block diagram of an example overall configuration of the semiconductor storage device according to one embodiment.

As shown in FIG. 1, the semiconductor storage device 1 of the present embodiment includes a memory core unit 10 and a peripheral circuit unit 20.

The memory core unit 10 includes a memory cell array 11, a row decoder 12, and a sense amplifier 13.

The memory cell array 11 includes a plurality of blocks BLK0, BLK1, etc. (herein may also be collectively referred to as a block or blocks BLK. Each of the blocks BLK includes a plurality of string units SU0, SU1, etc. (herein may also be collectively referred to as a string unit or string units SU) as a set of NAND strings NS in which memory cell transistors are connected in series with each other. In the example of FIG. 1, four string units SU0 to SU3 are provided in each block BLK. Data is usually erased in block BLK units in conventional semiconductor storage devices. That is, the data stored by the memory cell transistors in one block BLK can be erased together all at once in the same erase operation such that the block BLK is the minimum unit size for the erase operation in conventional devices. In addition, in the present embodiment, a block BLK can also be divided into a plurality of regions (referred to as sub-blocks SBLK), and each of the sub-blocks SBLK can be independently erased from the others such that, in the present embodiment, the block BLK is not necessarily the minimum unit size for an erase operation. Each NAND string NS in a block BLK is divided into portions corresponding to the number of sub-blocks SBLK in the block BLK. The divided NAND strings NS portions are in the different sub-blocks SBLK. In the following example, a case where each block BLK includes two sub-blocks SBLK will be described. The two sub-blocks SBLK are referred to, respectively, as an "upper sub-block USBLK" and a "lower sub-block LSBLK" herein. In the example as shown in FIG. 1, the block BLK0 includes an upper sub-block USBLK0 and a lower sub-block LSBLK0. The block BLK1 includes an upper sub-block USBLK1 and a lower sub-block LSBLK1. In other examples, the number of blocks BLK in the memory cell array 11, the number of sub-blocks SBLK in block BLK, the number of string units SU in each block BLK, and the number of NAND strings NS in each string unit SU may, in general, be any numbers.

The row decoder 12 decodes a row address received from an external controller. The row decoder 12 selects a wiring or wirings in a row direction of the memory cell array 11 based on a decoding result. For example, the row decoder 12 applies voltages to various wirings, such as word lines and select gate lines, for selecting the row direction.

During data reading, the sense amplifier 13 senses data read from the blocks BLK via a bit line. During data writing, the sense amplifier 13 applies a voltage to the memory cell array 11 in accordance with write data via the bit line.

The peripheral circuit unit 20 includes a sequencer 21 and a voltage generation circuit 22.

The sequencer 21 controls operations of the semiconductor storage device 1. For example, the sequencer 21 controls the voltage generation circuit 22, the row decoder 12, the sense amplifier 13, and the like during a write operation, a read operation, and an erase operation.

The voltage generation circuit 22 generates a voltage used for the write operation, the read operation, and the erase operation and supplies the voltage to the memory cell array 11, the row decoder 12, the sense amplifier 13, and the like.

1.2 Circuit Configuration of Memory Cell Array

Figure 2:
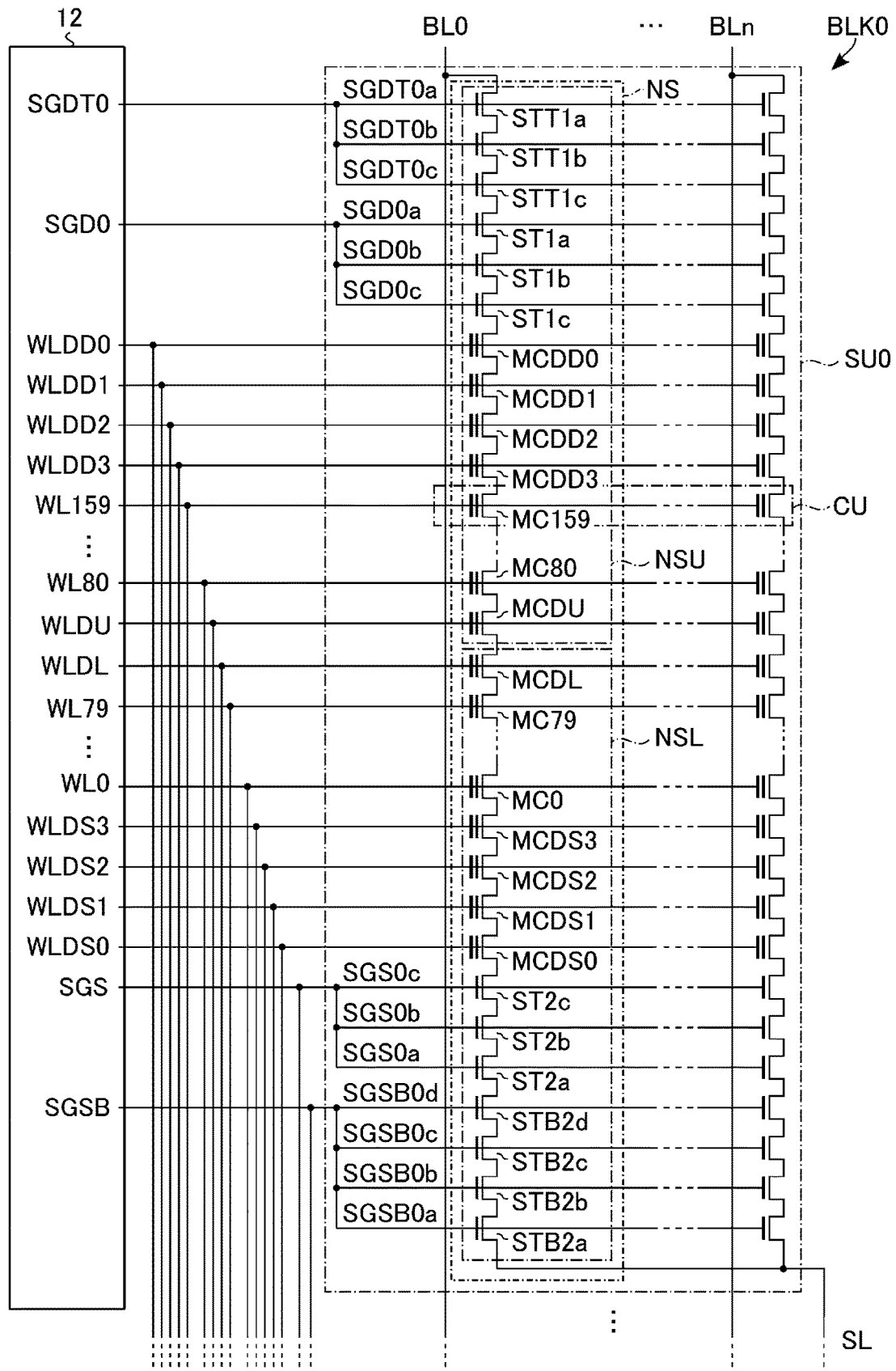
FIG. 2 is a circuit diagram of a memory cell array in a semiconductor storage device according to an embodiment.

FIG. 2 is a circuit diagram of the string unit SU0 of the block BLK0. Other blocks BLK and string units SU have the same or substantially the same configuration as that of the block BLK0 and string unit SU0.

As shown in FIG. 2, the string unit SU0 of the block BLK0 includes a plurality of NAND strings NS. Each of the NAND strings NS includes, for example, 160 memory cell transistors MC0 to MC159, 10 dummy memory cell transistors MCDD0 to MCDD3, MCDU, MCDL, and MCDS0 to MCDS3, and 13 select transistors STT1a to STT1c, ST1a to ST1c, ST2a to ST2c, and STB2a to STB2d. The memory cell transistors MC0 to MC159 may each be referred to as a memory cell transistor MC, or collectively as memory cell transistors MC. The dummy memory cell transistors MCDD0 to MCDD3 may each be referred to as a dummy memory cell transistor MCDD, or collectively as dummy memory cell transistors MCDD. The dummy memory cell transistors MCDS0 to MCDS3 may each be referred to as a dummy memory cell transistor MCDS, or collectively a dummy memory cell transistors MCDS. The dummy memory cell transistor MCDD, MCDU, MCDL, and MCDS may each be referred to as a dummy memory cell transistor MCD, or collectively as dummy memory cell transistors MCD. The select transistors STT1a to STT1c may each be referred to as a select transistor STT1, or collectively as select transistors STT1. The select transistors ST1a to ST1c may each be collectively referred to as a select transistor ST1, or collectively as select transistors ST1. The select transistors ST2a to ST2c may each be referred to as a select transistor ST2, or collective as select transistors ST2. The select transistors STB2a to STB2d may each be referred to as a select transistor STB2, or collectively as select transistors STB2.

The memory cell transistor MC and the dummy memory cell transistor MCD both include a control gate and a charge storage layer. The memory cell transistor MC stores the data in a non-volatile manner. While the dummy memory cell transistor MCD has the same, or substantially the same, configuration as the memory cell transistor MC, the dummy memory cell transistor MCD is used as a dummy and is not used for storing data.

The memory cell transistor MC and the dummy memory cell transistor MCD may be a MONOS (metal-oxide-nitride-oxide-semiconductor) type using an insulating film for the charge storage layer or an FG (floating gate) type using a conductive layer for the charge storage layer. The number of memory cell transistors MC and the number of dummy memory cell transistors MCD in the NAND string NS may be any numbers. In another embodiment, the dummy memory cell transistor MCD may not be provided.

The select transistors ST1 and ST2 are used for selecting the string unit SU (or the NAND string NS). In a similar manner to the select transistors ST1 and ST2, the select transistors STT1 and STB2 are used for selecting the string unit SU (or the NAND string NS) during the write operation and the read operation. The select transistors STT1 and STB2 are used to generate a gate induced drain leakage (GIDL) current during the erase operation. The number of select transistors ST1, ST2, STT1, and STB2 may be any number, and the number for each may be one or more.

In the NAND string NS, current paths of the memory cell transistor MC, the dummy memory cell transistor MCD, and the select transistors ST1, ST2, STT1, and STB2 are connected in series with one another. For example, the current paths are connected in series in the order of, for example, the select transistors STB2a to STB2d and ST2a to ST2c, the dummy memory cell transistors MCDS0 to MCDS3, the memory cell transistors MC0 to MC79, the dummy memory cell transistors MCDL and MCDU, the memory cell transistors MC80 to MC159, the dummy memory cell transistors MCDD3 to MCDD0, and the select transistors ST1c to ST1a and STT1c to STT1a.

In the present embodiment, the NAND string NS includes a lower string NSL corresponding to the lower sub-block LBLK and an upper string NSU corresponding to the upper sub-block USBLK. In the example of FIG. 2, the lower string NSL includes the memory cell transistors MC0 to MC79, the dummy memory cell transistors MCDS0 to MCDS3 and MCDL, and the select transistors ST2a to ST2c and STB2a to STB2d. The upper string NSU includes the memory cell transistors MC80 to MC159, the dummy memory cell transistors MCDD0 to MCDD3 and MCDU, and the select transistors ST1a to ST1c and STT1a to STT1c. In the erase operation of the lower sub-block LSBLK, the data of the memory cell transistors MC0 to MC79 in the block BLK can be erased. In the erase operation of the upper sub-block USBLK, the data of the memory cell transistors MC80 to MC159 in the block BLK can be erased.

The control gates of the memory cell transistors MC0 to MC159 in the block BLK are commonly connected to word lines WL0 to WL159, respectively. For example, the memory cell transistor MC0 of the plurality of NAND strings NS in the string units SU0 to SU3 in the block BLK0 is commonly connected to the word line WL0. The same applies to the other memory cell transistors MC. The control gates of the dummy memory cell transistors MCDD0 to MCDD3, MCDU, MCDL, and MCDS0 to MCDS3 in the block BLK are commonly connected to dummy word lines WLDD0 to WLDD3, WLDU, WLDL, and WLDS0 to WLDS3, respectively. The word lines WL0 to WL159 may be each referred to as a word line WL, or collectively as word lines WL. The dummy word lines WLDD0 to WLDD3, WLDU, WLDL, and WLDS0 to WLDS3 may each be referred to as a dummy word line WLD, or collectively as dummy word lines WLD.

The word lines WL0 to WL159 and the dummy word lines WLDD0 to WLDD3, WLDU, WLDL, and WLDS0 to WLDS3 are connected to the row decoder 12 and are independently controlled.

The gates of the plurality of select transistors STT1a to STT1c and ST1a to ST1c in the string unit SU are commonly connected to one select gate line corresponding to the string unit SU. For example, the gates of the plurality of select transistors STT1a to STT1c in the string unit SU0 are commonly connected to select gate lines SGDT0a to SGDT0c, respectively. The gates of the plurality of select transistors ST1a to ST1c in the string unit SU0 are commonly connected to select gate lines SGD0a to SGD0c, respectively. Then, the select gate lines SGDT0a to SGDT0c are commonly connected to a select gate line SGDT0. The select gate lines SGD0a to SGD0c are commonly connected to a select gate line SGD0.

The gates of the plurality of select transistors STT1a to STT1c in the string unit SU1 are commonly connected to select gate lines SGDT1a to SGDT1c, respectively. The gates of the plurality of select transistors ST1a to ST1c in the string unit SU1 are commonly connected to select gate lines SGD1a to SGD1c, respectively. Then, the select gate lines SGDT1a to SGDT1c are commonly connected to a select gate line SGDT1. The select gate lines SGD1a to SGD1c are commonly connected to a select gate line SGD1. The wirings corresponding to the select gate lines SGDT0 and SGD0 in the string unit SU0 may be referred to as select gate lines SGDT and SGD, respectively.

The select gate lines SGDT0 and SGD0 are connected to the row decoder 12 and are independently controlled. The same applies to the other string units SU1 to SU3. Therefore, the row decoder 12 can apply different voltages to the select gate lines SGDT and SGD in each string unit SU. Furthermore, for example, the select gate lines SGDT0a to SGDT0c and SGD0a to SGD0c in the string unit SU0 may be independently controlled by the row decoder 12. The same applies to the other string units SU.

The gates of the plurality of select transistors STB2a to STB2d in the block BLK are commonly connected to one select gate line SGSB. The gates of the plurality of select transistors ST2a to ST2c in the block BLK are commonly connected to one select gate line SGS. For example, the gates of the plurality of select transistors STB2a to STB2d in the string unit SU0 are commonly connected to select gate lines SGSB0a to SGSB0d, respectively. The gates of the plurality of select transistors ST2a to ST2c in the string unit SU0 are commonly connected to select gate lines SGS0a to SGS0c, respectively. Then, the select gate lines SGSB0a to SGSB0d are commonly connected to the select gate line SGSB. The select gate lines SGS0a to SGS0c are commonly connected to the select gate line SGS. The same applies to the other string units SU. Different select gate lines SGSB and SGS may be provided for each string unit SU.

The select gate lines SGSB and SGS are connected to the row decoder 12 and are independently controlled. Therefore, the row decoder 12 can apply different voltages to the select gate lines SGSB and SGS. Furthermore, for example, the select gate lines SGSB0a to SGSB0d and SGS0a to SGS0c in the string unit SU0 may be independently controlled by the row decoder 12. The same applies to the other string units SU.

The drains of the select transistors STT1a of the plurality of NAND strings NS in the string unit SU are connected to different bit lines BL0 to BLn (n is an integer of 1 or more).

The bit lines BL0 to BLn may be collectively referred to as bit lines BL or individually as a bit line BL. Each bit line BL is connected to the sense amplifier 13 and can be independently controlled.

The sources of the plurality of select transistors STB2a in the block BLK are commonly connected to the source line SL.

In the present embodiment, the string unit SU is a set of the NAND strings NS connected to the different bit lines BL but connected to the same select gate lines SGDT and SGD. The block BLK is a set of the plurality of string units SU having common word lines WL. The memory cell array 11 is a set of blocks BLK having common bit lines BL.

The write operation and the read operation are collectively performed on the plurality of memory cell transistors MC connected to the word lines WL in the string units SU. A group of the memory cell transistors MC that are collectively selected during the write operation and the read operation may be referred to as a "cell unit CU" herein. A collection of 1-bit data written in or read from one cell unit CU may be referred to as a "page" herein.

1.3 Cross-Sectional Configuration of Memory Cell Array

Figure 3:
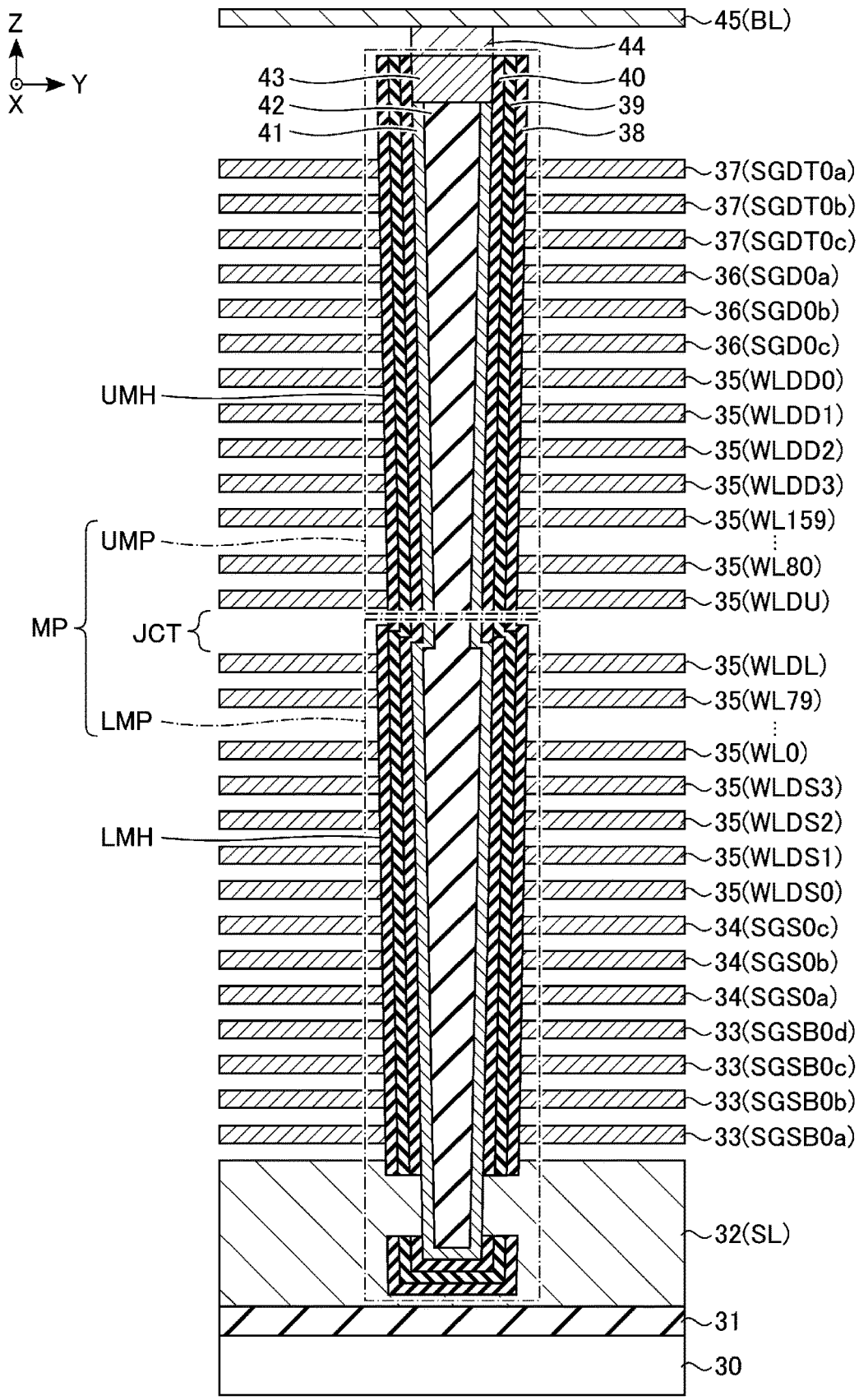
FIG. 3 depicts a memory cell array in a semiconductor storage device in a cross-sectional view according to an embodiment.

FIG. 3 shows a cross section of one NAND string NS in the string unit SU0. In the example of FIG. 3, some interlayer insulating films are omitted from the depiction for clarity.

As shown in FIG. 3, an insulating layer 31 is formed on a semiconductor substrate 30. For the insulating layer 31, for example, a silicon oxide film ($SiO_2$) is used. A circuit, such as a row decoder 12 or the sense amplifier 13, may be provided in a region where the insulating layer 31 is formed between the semiconductor substrate 30 and a wiring layer 32.

The wiring layer 32 is formed on the insulating layer 31 such that the wiring layer 32 extends both in the X direction substantially parallel to the semiconductor substrate 30 and in the Y direction intersecting the X directions. The wiring layer 32 functions as a source line SL. The wiring layer 32 is made of a conductive material, and for example, an n-type semiconductor in which impurities are added to a semiconductor such as silicon (Si) is used. As one example, phosphorus-doped polysilicon (P doped poly-Si) may be used as the wiring layer 32.

A four-layered wiring layer 33 is stacked above the wiring layer 32 with a gap therebetween in the Z direction perpendicular to the semiconductor substrate 30. The four-layered wiring layer 33 extends in the X direction and functions as the select gate lines SGSB0a to SGSB0d from the lower layer. A three-layered wiring layer 34 is stacked above the four-layered wiring layer 33 with a gap therebetween in the Z direction. The three-layered wiring layer 34 extends in the X direction and functions as the select gate lines SGS0a to SGS0c from the lower layer. A 170-layered wiring layer 35 is stacked above the three-layered wiring layer 34 with a gap therebetween in the Z direction. The 170-layered wiring layer 35 functions as the dummy word lines WLDS0 to WLDS3, the word lines WL0 to WL79, the dummy word lines WLDL and WLDU, the word lines WL80 to WL159, and the dummy word lines WLDD3 to WLDD0 from the lower layer. A three-layered wiring layer 36 is stacked above the wiring layer 35 with a gap therebetween in the Z direction. The three-layered wiring layer 36 extends in the X direction and functions as the select gate lines SGD0c to SGD0a from the lower layer. A three-layered wiring layer 37 is stacked above the three-layered wiring layer 36 with a gap therebetween in the Z direction. The three-layered wiring layer 37 extends in the X direction and functions as the select gate lines SGDT0c to SGDT0a from the lower layer. As the conductive material, a metal material, an n-type semiconductor, a p-type semiconductor, or the like may be used for the wiring layers 33 to 37. For example, phosphorus-doped polysilicon may be used for the wiring layer 33, and a stacked structure of titanium nitride (TiN)/tungsten (W) is used for the wiring layers 34 to 37. TiN has a function as a barrier layer for preventing reaction between W and $SiO_2$ or as an adhesion layer for improving adhesion of W when W is formed by, for example, chemical vapor deposition (CVD).

A memory pillar MP that penetrates the wiring layers 33 to 37 and reaches the wiring layer 32 is provided. One memory pillar MP corresponds to one NAND string NS. The memory pillar MP includes, for example, two memory pillars LMP and UMP. In the present embodiment, for example, the memory pillar LMP corresponds to the lower string NSL, that is, the lower sub-block LBLK. The memory pillar LMP passes through (or penetrates) the wiring layers 33 and 34 and the wiring layer 35 functioning as the dummy word lines WLDS0 to WLDS3, the word lines WL0 to WL79, and the dummy word line WLDL. A bottom surface of the memory pillar LMP reaches the wiring layer 32. The memory pillar UMP corresponds to the upper string NSU, that is, the upper sub-block UBLK. The memory pillar UMP is provided on the memory pillar LMP and passes through, for example, the wiring layer 35 functioning as the dummy word lines WLDU, the word lines WL80 to WL159, and the dummy word lines WLDD3 to WLDD0, and the wiring layers 36 and 37. The memory pillars LMP and UMP are connected to each other in the Z direction with a step difference therebetween on a side surface to form the memory pillar MP. A connection portion between the memory pillar LMP and the memory pillar UMP including the step difference on the side surface is also referred to as a junction JCT herein. While the two memory pillars LMP and UMP are connected to form the memory pillar MP, the number of pillars or pillar stages connected in the Z-axis direction can be any number. The memory pillar MP may have a one-stage configuration or a configuration of three or more stages.

The memory pillar MP includes a block insulating film 38, a charge storage layer 39, a tunnel insulating film 40, a semiconductor layer 41, a core layer 42, and a cap layer 43.

A memory hole LMH corresponding to the memory pillar LMP and a memory hole UMH corresponding to the memory pillar UMP are formed. The block insulating film 38, the charge storage layer 39, and the tunnel insulating film 40 are sequentially formed on a side surface of the memory hole UMH and a portion of a side surface and a bottom surface of the memory hole LMH. Inner portions of the memory holes LMH and UMH are buried by the semiconductor layer 41 and the core layer 42. In an upper portion of the memory hole UMH, the cap layer 43 is provided on the semiconductor layer 41 and the core layer 42. The semiconductor layer 41 is a region in which channels of the memory cell transistor MC, the dummy memory cell transistor MCD, and the select transistors ST1, STT1, ST2, and STB2 are formed. The block insulating film 38, the charge storage layer 39, and the tunnel insulating film 40 on the side surfaces of the memory holes LMH and UMH are formed so that the wiring layers 33 to 37 and the semiconductor layer 41 are not in contact with each other. For example, in the memory holes LMH and UMH, the block insulating film 38, the charge storage layer 39, and the tunnel insulating film 40 are formed on the side surface including the region that is in contact with the wiring layers 33 to 37. Then, the block insulating film 38, the charge storage layer 39, and the tunnel insulating film 40 are removed in a portion of the region where the side surface of the memory hole LMH and the wiring layer 32 are in contact with each other. A portion of a side surface of the semiconductor layer 41 is in contact with the wiring layer 32.

The memory cell transistors MC0 to MC159 are configured with the memory pillar MP and the wiring layer 35 functioning as the word lines WL0 to WL159. The dummy memory cell transistors MCDD0 to MCDD3, MCDU, MCDL, and MCDS0 to MCDS3 are configured with the memory pillar MP and the wiring layers 35 functioning as the dummy word lines WLDD0 to WLDD3, WLDU, WLDL, and WLDS0 to WLDS3. The select transistors STT1a to STT1c are configured with the memory pillar MP and the wiring layer 37 functioning as the select gate lines SGDT0a to SGDT0c. The select transistors ST1a to ST1c are configured with the memory pillar MP and the wiring layer 36 functioning as the select gate lines SGD0a to SGD0c. The select transistors ST2a to ST2c are configured with the memory pillar MP and the wiring layer 34 functioning as the select gate lines SGS0a to SGS0c. The select transistors STB2a to STB2d are configured with the memory pillar MP and the wiring layer 33 functioning as the select gate lines SGSB0a to SGSB0d.

For example, $SiO_2$ is used for the block insulating film 38, the tunnel insulating film 40, and the core layer 42. For the charge storage layer 39, for example, a silicon nitride film (SiN) is used. For the semiconductor layer 41, for example, polysilicon is used. For the cap layer 43, for example, an n-type semiconductor is used.

A contact plug 44 is formed on the cap layer 43. A wiring layer 45 functioning as a bit line BL and extending in the Y direction is formed on the contact plug 44. The contact plug 44 and the wiring layer 45 are made of a conductive material, and for example, a stacked structure of titanium (Ti)/TiN/W, copper wiring, or the like is used.

An n-type semiconductor may be used for the semiconductor layer 41 in the junction JCT region.

2. Impurity Concentration of Memory Pillar

Figure 4:
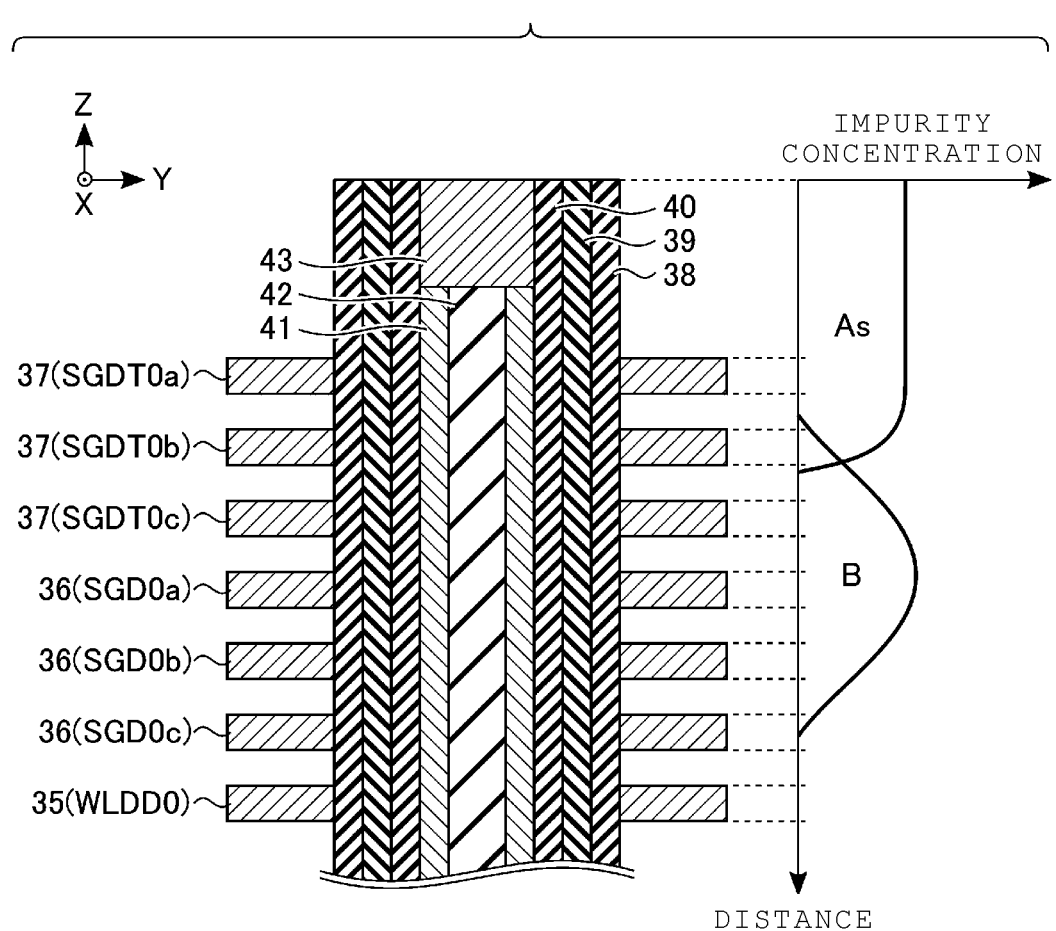
FIG. 4 depicts aspects related to a concentration profile of impurities in a memory pillar MP in a semiconductor storage device according to an embodiment.

FIG. 4 depicts an example concentration profile of impurities in the semiconductor layer 41 of the memory pillar MP. In the example of FIG. 4, arsenic (As) may be used as an impurity for forming an n-type semiconductor.

As shown in FIG. 4, a region (that is a region facing the select gate lines SGDT0a to SGDT0c) where a channel of the select transistor STT1 of the semiconductor layer 41 is formed is doped with As, for example, by ion implantation. Accordingly, the n-type semiconductor is formed in the semiconductor layer 41 in the region corresponding to the select transistor STT1. In the present embodiment, during the erase operation, the GIDL current is generated by using the select transistors STT1 and STB2. In order to efficiently generate the GIDL current in the select transistor STT1, the channel region of the select transistor STT1 may be, for example, an n-type semiconductor doped with impurities of $1 \times 10^{19}$ atoms/$cm^3$ or more. In the present embodiment, the n-type semiconductor may be formed in at least one channel region of the three select transistors STT1a to STT1c. In one instance, in the semiconductor layer 41, As may be doped from an upper surface of the memory pillar MP (or the cap layer 43) to a side lower than a lower surface of the select gate line SGDT0a. However, when arsenic (As) diffuses to a region (that is a side lower than an upper surface of the select gate line SGD0a) corresponding to the select transistor ST1 of the semiconductor layer 41, a threshold voltage of the select transistor ST1 may fluctuate and a malfunction may occur in a select operation of the NAND string NS. For this reason, in the present embodiment, a diffusion depth of arsenic (As) is controlled by, for example, an acceleration voltage of ion implantation so that arsenic (As) does not diffuse to the region corresponding to the select transistor ST1 of the semiconductor layer 41. In the case where arsenic (As) is used, a profile of the semiconductor layer 41 in the Z direction (that is a depth direction) can be made steeper than that of P, and the control in the depth direction becomes easier. In another instance, P may be used instead of As.

Even in a region corresponding to the select transistor STB2 of the semiconductor layer 41, for example, an n-type semiconductor can be formed by diffusing P from the wiring layer 32, such as phosphorus-doped polysilicon. In this case, P is made not to diffuse into the region corresponding to the select transistor ST2 of the semiconductor layer 41.

In the present embodiment, in order to improve a cutoff characteristic of the select transistor ST1, a region where a channel of the select transistor ST1 is formed is doped with boron (B), for example, by ion implantation. In this case, when B diffuses to a region corresponding to the dummy memory cell transistor MCD of the semiconductor layer 41 (that is a side lower than an upper surface of the dummy word line WLDD0), a threshold voltage of the dummy memory cell transistor MCD may fluctuate. For this reason, in the present embodiment, B is controlled so as not to diffuse to the region corresponding to the dummy memory cell transistor MCD of the semiconductor layer 41. In another instance, B may not be doped.

3. Erase Operation

The erase operation of the present embodiment includes a block erase mode (may also be referred to as a first mode herein) and a sub-block erase mode (may also be referred to as a second mode herein). The block erase mode is a mode in which the erase operation is executed by selecting one block BLK among the plurality of blocks BLKs. The sub-block erase mode is a mode in which the erase operation is executed by selecting one of the upper sub-block USBLK and the lower sub-block LSBLK.

An erase operation generally includes an erasing pulse apply operation and an erasing verify operation. The erasing pulse apply operation applies an erasing pulse to lower the threshold voltage of the memory cell transistors MC. The erasing verify operation is a determination as to whether the threshold voltage of the memory cell transistor MC has been lowered to a target value or less by the applying of the erasing pulse. In the erase operation, the threshold voltage of a memory cell transistor MC is eventually lowered to an erase level by repeating the combination of the erasing pulse apply operation and the erasing verify operation.

3.1 Block Erase Mode

Figure 5:
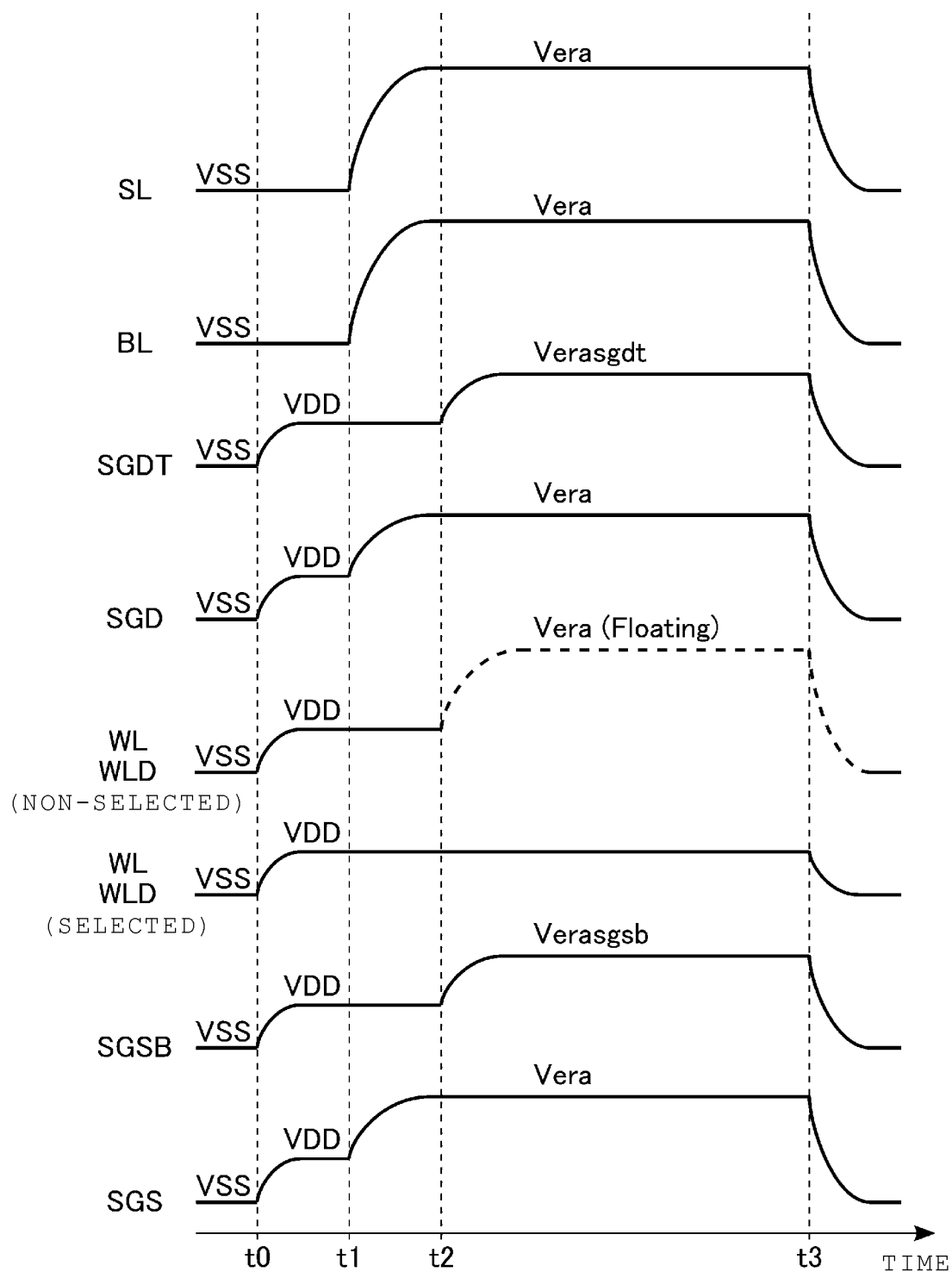
FIG. 5 is a timing chart illustrating voltages of wirings during a block erase mode in a semiconductor storage device according to an embodiment.

FIG. 5 is a timing chart of the voltages of wirings during the erasing pulse apply operation in the block erase mode.

As shown in FIG. 5, at time t0, the row decoder 12 applies a power supply voltage VDD to the select gate lines SGDT, SGD, SGSB, and SGS, the word line WL, and the dummy word line WLD of a block BLK which is an erase target (a "selected block BLK"). In addition, the row decoder 12 applies the power supply voltage VDD to the word line WL and the dummy word line WLD of a block BLK which is not an erase target (a "non-selected block BLK"). In some examples, the voltage applied to the word lines WL and the dummy word lines WLD may not be the power supply voltage VDD. For example, the voltage applied to the word lines WL and the dummy word lines WLD may be lower than the power supply voltage VDD so that holes generated by GIDL will be injected into the charge storage layers 39 of the corresponding memory cell transistors MC and dummy memory cell transistors MCD. In still another instance, the row decoder 12 may allow the word line WL and the dummy word line WLD of the non-selected block BLK to be in a floating state without applying the power supply voltage VDD to the word line WL and the dummy word line WLD of the non-selected block BLK.

Next, at time t1, a voltage Vera is applied to the source line SL and the bit line BL. The voltage Vera is a high voltage for generating the GIDL. Then, the row decoder 12 applies the voltage Vera to the select gate lines SGD and SGS to prevent the injection of holes into the charge storage layers 39 of the select transistors ST1 and ST2. In some examples, a voltage different from the voltage Vera may be applied to either one of the select gate lines SGD and SGS. In such a case, the voltages applied to the select gate lines SGD and SGS may be different from each other. For example, a voltage higher than the power supply voltage VDD may be applied to the select gate lines SGD or select gate lines SGS.

Next, during the period from time t2 to t3, the row decoder 12 applies a voltage Verasgdt and a voltage Verasgsb to the select gate lines SGDT and SGSB of the selected block BLK, respectively. For the select transistor STT1, the voltage Verasgdt is a high voltage for generating the GIDL and is lower than the voltage Vera but higher than the power supply voltage VDD. For the select transistor STB2, the voltage Verasgsb is a high voltage for generating the GIDL and is lower than the voltage Vera but higher than the power supply voltage VDD. The voltage Verasgdt and the voltage Verasgsb may be different voltages or may be the same voltage. Accordingly, the GIDL is generated in the select transistors STT1 and STB2 of the selected block BLK. The holes generated by the GIDL are injected into the charge storage layers 39 of the memory cell transistors MC and the dummy memory cell transistors MCD in the selected block BLK. In other words, the holes are supplied to the memory cell transistors MC and the dummy memory cell transistors MCD from the bit line BL side and the source line side (whereby data is erased).

The row decoder 12 allows the word line WL and the dummy word line WLD of the non-selected block BLK to be in a floating state during the period from time t2 to t3. Since the word lines WL and the dummy word lines WLD of the non-selected block BLK are in a floating state, the voltages of these word lines WL and the dummy word lines WLD rise to, for example, the voltage Vera due to coupling with the semiconductor layer 41 (a channel layer) to which the voltage Vera is applied. For this reason, the holes are not supplied to the memory cell transistors MC and the dummy memory cell transistors MCD of the non-selected block BLK (so data therein is not erased).

At time t3, a refresh operation is executed, and the power supply voltage VSS is applied to each wiring.

3.2 Sub-Block Erase Mode

Figure 6:
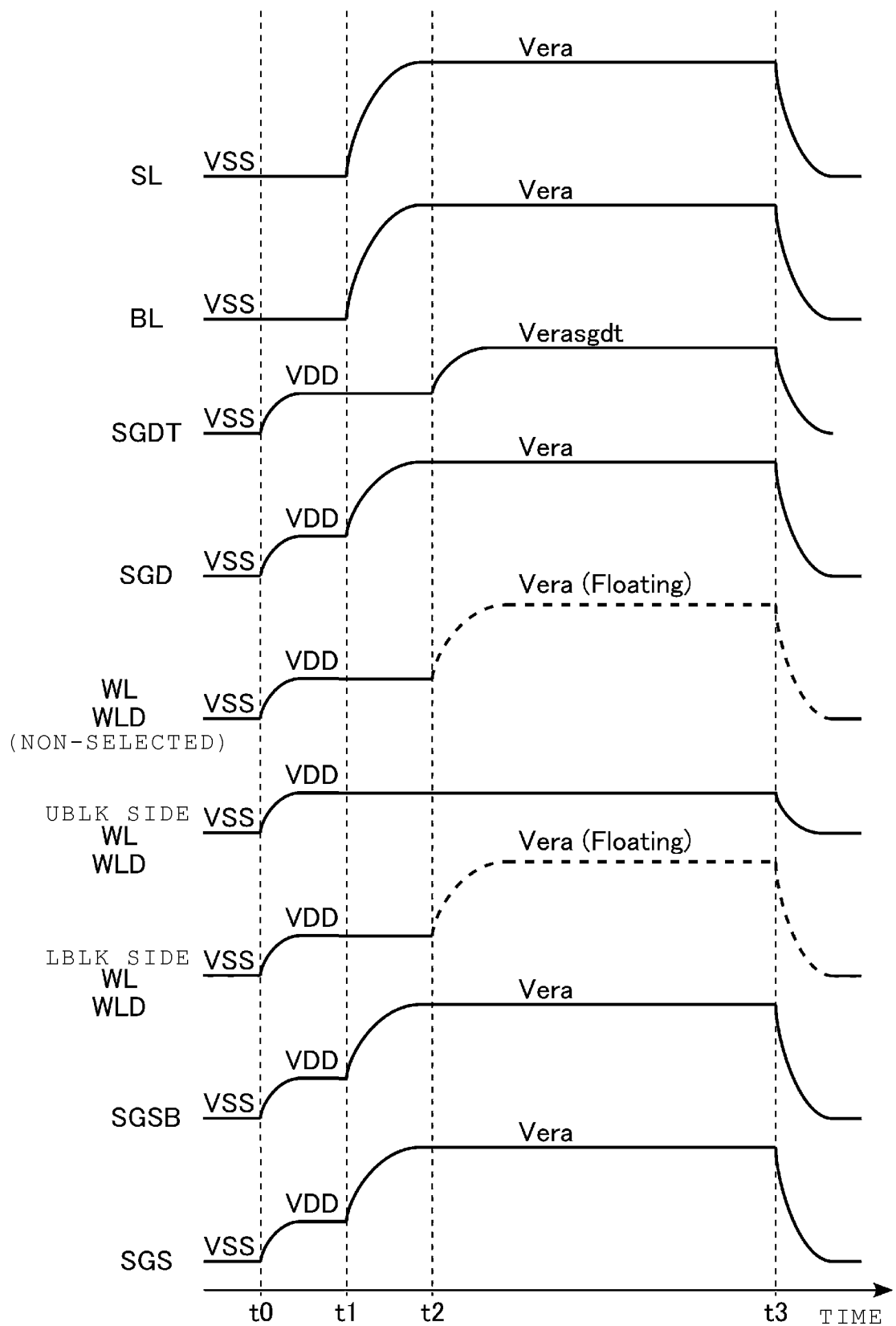
FIG. 6 is a timing chart illustrating voltages of wirings during a sub-block erase mode in a semiconductor storage device according to an embodiment.
Figure 7:
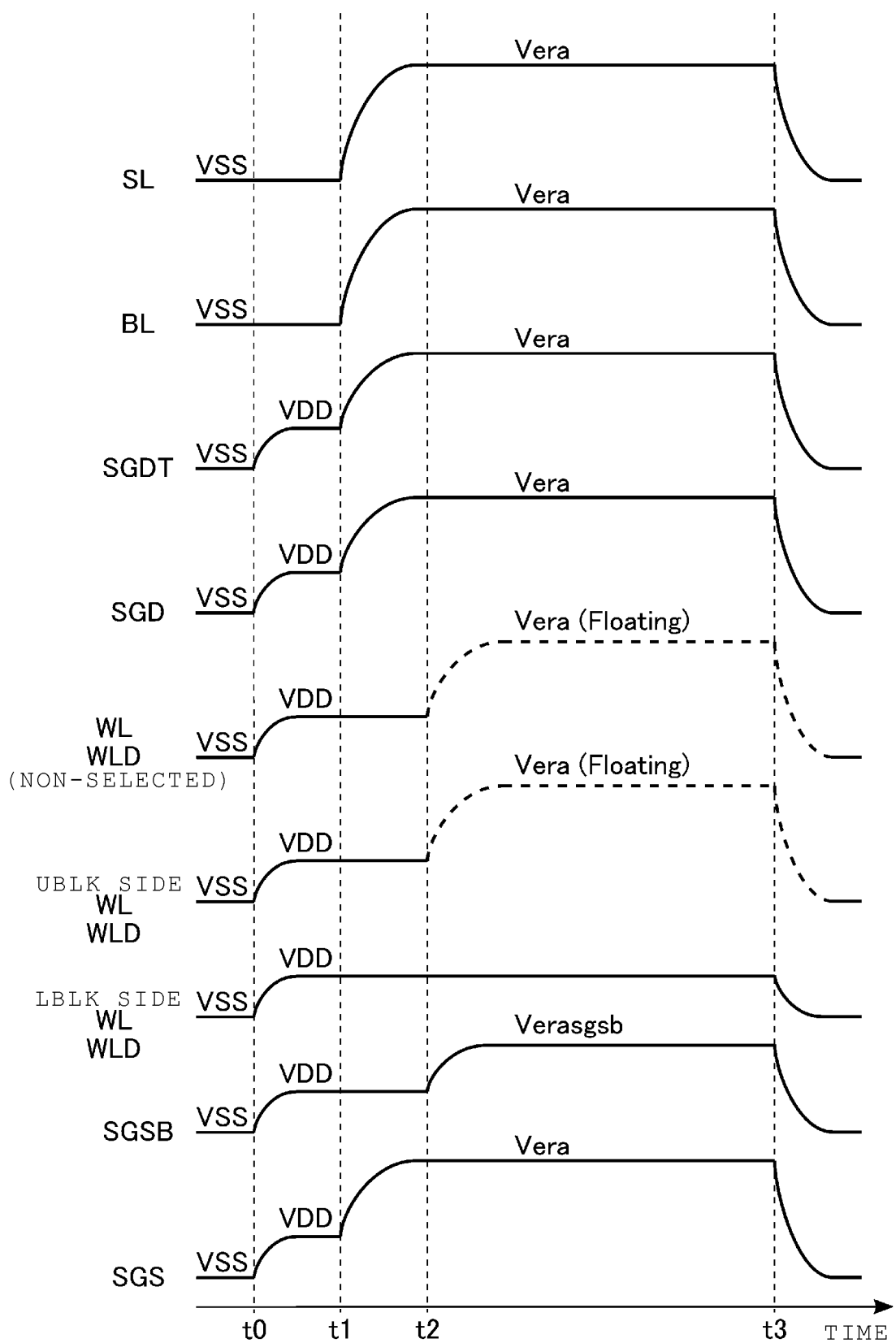
FIG. 7 is a timing chart illustrating voltages of wirings during a sub-block erase mode in a semiconductor storage device according to an embodiment.

FIG. 6 is a timing chart of the voltages of wirings during the erasing pulse apply operation of a sub-block erase mode in the erase operation of the upper sub-block USBLK. FIG. 7 is a timing chart of the voltages of wirings during the erasing pulse apply operation of a sub-block erase mode in the erase operation of the lower sub-block LSBLK.

For the erase operation of the upper sub-block, as illustrated in FIG. 6, the operation at time t0 is the same as that in the block erase mode (FIG. 5).

Next, at time t1, the voltage Vera is applied to the source line SL and the bit line BL. The row decoder 12 applies the voltage Vera to the select gate lines SGD, SGS, and SGSB. In other examples, voltages different from the voltage Vera may be applied to the select gate lines SGD, SGS, and SGSB, respectively. In such a case, the voltages applied to the select gate lines SGD, SGS, and SGSB may also be different from each other.

Next, during the period from time t2 to t3, the row decoder 12 applies the voltage Verasgdt to the select gate line SGDT of the selected block BLK. In addition, the row decoder 12 sets the word line WL and the dummy word line WLD on the lower sub-block LBLK side, which are not erase targets in this example, to be in a floating state. The GIDL is generated in the select transistor STT1 during the period from time t2 to t3. Since the word lines WL and the dummy word lines WLD on the lower sub-block LSBLK side are in the floating state, the voltages of these word lines WL and the dummy word lines WLD rise to, for example, the voltage Vera due to coupling with the semiconductor layer 41 to which the voltage Vera is applied from the bit line BL side. In this state, the holes generated by the GIDL are injected into the charge storage layers 39 of the memory cell transistors MC and the dummy memory cell transistors MCD on the upper sub-block USBLK side in the selected block BLK. In other words, the holes are supplied from the bit line BL side to the memory cell transistors MC and the dummy memory cell transistors MCD of the upper sub-block USBLK (whereby data is erased). On the other hand, the holes are not supplied to the memory cell transistors MC and the dummy memory cell transistors MCD of the lower sub-block LSBLK (so data therein is not erased).

At time t3, the refresh operation is executed, and the power supply voltage VSS is applied to each wiring.

For the erase operation of the lower sub-block, as shown in FIG. 7, the operation at time t0 is the same as those shown in FIGS. 5 and 6.

Next, at time t1, the voltage Vera is applied to the source line SL and the bit line BL. The row decoder 12 applies the voltage Vera to the select gate lines SGDT, SGD, and SGS. In other examples, voltages different from the voltage Vera may be applied to the select gate lines SGDT, SGD, and SGS, respectively. In such a case, the voltages applied to the select gate lines SGDT, SGD, and SGS may be different from each other.

During the period from time t2 to t3, the row decoder 12 applies the voltage Verasgsb to the select gate line SGSB of the selected block BLK. In addition, the row decoder 12 sets the word lines WL and the dummy word lines WLD on the upper sub-block UBLK side, which are not erase objects in this example, to be in a floating state. The GIDL is generated in the select transistor STB2 during the period from time t2 to time t3. Since the word lines WL and the dummy word lines WLD on the upper sub-block USBLK side are in the floating state, the voltages of these word lines WL and the dummy word lines WLD rise to, for example, the voltage Vera due to coupling with the semiconductor layer 41 to which the voltage Vera is applied from the source line SL side. In this state, the holes generated by the GIDL are injected into the charge storage layers 39 of the memory cell transistors MC and the dummy memory cell transistors MCD on the lower sub-block LSBLK side in the selected block BLK. In other words, holes are supplied to the memory cell transistors MC and the dummy memory cell transistors MCD of the lower sub-block LSBLK from the source line SL side (whereby data is erased). On the other hand, holes are not supplied to the memory cell transistors MC and the dummy memory cell transistors MCD of the upper sub-block USBLK (so data therein is not erased).

At time t3, the refresh operation is executed, and the power supply voltage VSS is applied to each wiring.

4. Effect of Embodiment

According to the present embodiment, the processing capacity of the semiconductor storage device can be improved.

For example, in the erase operation, in a case where the holes are supplied from the source line SL side to each memory cell transistor MC in a NAND string NS, when the length of the semiconductor layer 41 in the memory pillar MP becomes longer, the holes might not be sufficiently supplied to the memory cell transistors MC nearer the bit line BL. This might lead to a longer processing time for the erase operation. In addition, since more holes might be injected into the memory cell transistor MC nearer the source line SL, the memory cell transistor MC might be in an over-erased state where the threshold voltage thereof might be shifted to a negative voltage side. In a case of writing data to a memory cell transistor MC in the over-erased state, the processing time of the write operation might become longer as compared with a case of writing data to a memory cell transistor MC of which the threshold voltage is near 0 V.

On the other hand, in the present embodiment, the NAND string NS includes the select transistors STT1 and STB2, which are used for generating the GIDL during the erase operation, and the select transistors ST1 and ST2, which are used for selecting the NAND string NS. Also, different voltages can be applied to the respective select gate lines SGDT, SGD, SGSB, and SGS. Accordingly, during the erase operation, the holes can be sufficiently supplied to each memory cell transistor MC in the NAND string NS from both the source line SL side and the bit line BL side. This shortens the processing time of the erase operation. Furthermore, over-erasing can be prevented, and an increase in the processing time of a subsequent write operation can thus be prevented. Therefore, the processing capacity of the semiconductor storage device can be effectively improved.

According to the present embodiment, the holes can also be sufficiently supplied to each memory cell transistor MC in the NAND string NS from either the bit line BL side or the source line SL side. This enables a sub-block erase operation to be executed. For example, the erase operation can be executed by selecting either region within the block BLK as an erase target.

In addition, since the sub-block erase operation can be executed, when garbage collection (or compaction) is executed before the erase operation, the amount of valid data to be moved to the unused block BLK can be reduced. Accordingly, an increase in the processing time of garbage collection can be prevented. This further improves the processing capacity of the semiconductor storage device.

Furthermore, in the present embodiment, an n-type semiconductor can be formed in the channel region of the select transistor STT1 of the semiconductor layer 41. This achieves the further efficient generation of the GIDL current in the select transistor STT1.

5. Modified Embodiments

The semiconductor storage device according to the one embodiment may include: a memory string including first to fourth select transistors and first and second memory cells connected in series with each other in order of the first select transistor (e.g., STT1); the second select transistor (e.g., ST1), the first memory cell (e.g., MC159); the second memory cell (e.g., MC0); the third select transistor (e.g., ST2), and the fourth select transistor (e.g., STB2); first to fourth select gate lines (e.g., SGDT, SGD, SGS, and SGSB) connected to gates of the first to fourth select transistors, respectively; first and second word lines (e.g., WL159 and WL0) connected to gates of the first and second memory cells (e.g., MC159, MC0), respectively; a bit line (BL) connected to the first select transistor; a source line (SL) connected to the fourth select transistor; and a row decoder configured to apply voltages to the first to fourth select gate lines and the first and second word lines. An erase operation includes a first mode (a block erase mode) for erasing data in the first and second memory cells and a second mode (a sub-block erase mode) for erasing one data in the first and second memory cells. In the first mode, a first voltage (e.g., Vera) is applied to the bit line and the source line, a second voltage (e.g., Verasgdt) lower than the first voltage to generate GIDL in the first select transistor is applied to the first select gate line, a third voltage (e.g., Vera) is applied to the second select gate line, a fourth voltage (e.g., Vera) is applied to the third select gate line, a fifth voltage (e.g., Verasgsb) lower than the first voltage to generate GIDL in the fourth select transistor is applied to the fourth select gate line, and a sixth voltage (e.g., VDD) lower than the first to fifth voltages is applied to the first and second word lines.

This semiconductor storage device according to the present embodiment achieves the improved processing capacity. Various modifications to the above-described embodiments are possible.

The terms "connection" or "connected" as used in the present disclosure includes a state in which components are indirectly connected to another component via another component such as a wire, a transistor current path, or a resistor interposed therebetween.

While certain embodiments have been described, these embodiments have been presented by way of example only and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device, comprising:
    a memory string comprising a first select transistor connected to a second select transistor, a first memory cell connected between the second select transistor and a second memory cell, and a third select transistor connected between the second memory cell and a fourth select transistor;
    first, second, third and fourth select gate lines connected to gates of the first, second, third and fourth select transistors, respectively;
    first and second word lines connected to gates of the first and second memory cells, respectively;
    a bit line connected to the first select transistor;
    a source line connected to the fourth select transistor;
    a row decoder configured to independently apply voltages to the first, second, third and fourth select gate lines and the first and second word lines; and
    a sequencer configured to perform a data erase operation on a memory block including the memory string, wherein
    the sequencer has a first mode for erasing the first and second memory cells at the same time in the data erase operation and a second mode for erasing just one of first and second memory cells in the data erase operation, and
    in the first mode:
        a first voltage is applied to the bit line and the source line,
        a second voltage lower than the first voltage is applied to the first select gate line,
        a third voltage is applied to the second select gate line,
        a fourth voltage is applied to the third select gate line,
        a fifth voltage lower than the first voltage is applied to the fourth select gate line, and
        a sixth voltage lower than the first, second, third, fourth and fifth voltages is applied to each of the first and second word lines.

2. The semiconductor storage device according to claim 1, wherein the first, second, third and fourth select transistors and first and second memory cells are arranged in a first direction perpendicular to a surface of a semiconductor substrate of the semiconductor storage device.

3. The semiconductor storage device according to claim 1, wherein, in the first mode,
    the second voltage is applied to the first select gate line to generate gate induced drain leakage in the first select transistor, and
    the fifth voltage is applied to the fourth select line to generate gate induced drain leakage in the fourth select transistor.

4. The semiconductor storage device according to claim 1, wherein, in the second mode, to erase data in the first memory cell but not the second memory cell,
    the first voltage is applied to the bit line and the source line,
    the second voltage is applied to the first select gate line,
    the third voltage is applied to the second select gate line,
    the fourth voltage is applied to the third and fourth select gate lines,
    the sixth voltage is applied to the first word line, and
    the second word line is set to be in a floating state.

5. The semiconductor storage device according to claim 1, wherein, in the second mode, to erase data in the second memory cell but not the first memory cell,
    the first voltage is applied to the bit line and the source line,
    the third voltage is applied to the first and second select gate lines,
    the fourth voltage is applied to the third select gate line,
    the fifth voltage is applied to the fourth select gate line,
    the first word line is set to be in a floating state, and
    the sixth voltage is applied to the second word line.

6. The semiconductor storage device according to claim 1, wherein a semiconductor material doped with arsenic or phosphorus is used for a channel of the first select transistor.

7. The semiconductor storage device according to claim 6, wherein a semiconductor material doped with boron is used for a channel of the second select transistor.

8. The semiconductor storage device according to claim 1, wherein the third voltage and the fourth voltage are the same as the first voltage.

9. The semiconductor storage device according to claim 8, wherein the first, second, third, fourth, fifth and sixth voltages are higher than a power supply voltage.

10. The semiconductor storage device according to claim 1, wherein
the first mode is a block erase mode in which the data erase operation is executed by selecting one memory block among a plurality of memory blocks in a memory cell array, and
the second mode is a sub-block erase mode in which the data erase operation is executed by selecting one of a plurality of sub-blocks in a memory block, the memory string being divided into portions within each of the sub-blocks.

11. The semiconductor storage device according to claim 10, wherein the sub-blocks are an upper sub-block and a lower sub-block.

12. The semiconductor storage device according to claim 1, wherein the memory string is a NAND string.

13. The semiconductor storage device according to claim 1, wherein the memory string further comprises a plurality of dummy memory cell transistors.

14. A semiconductor storage device, comprising:
a memory cell array comprising a plurality of memory blocks comprising a plurality of memory strings, each of the memory blocks being divided into first and second sub-blocks, and each of the memory strings being divided into first and second portions corresponding to the first and second sub-blocks, respectively, each memory string including, in the first portion, a first select transistor and a second select transistor connected in series and, in the second portion, a third select transistor and a fourth transistor connected in series, and a plurality of memory transistors connected in series between the second and third select transistors;
a row decoder configured to independently apply voltages to the first, second, third, and fourth select transistors in each memory string; and
a sequencer configured to perform a first mode data erase operation for erasing an entire memory block including the memory string and a second mode data erase operation to erase one of the first or second sub-blocks in a memory block, wherein
the sequencer has a first mode for erasing the first and second memory cells at the same time in the data erase operation and a second mode for erasing just one of first and second memory cells in the data erase operation, and
in the first mode:
a first voltage is applied to a bit line connected to a memory string in a memory block and a source line connected to the memory string,
a second voltage lower than the first voltage is applied to a first select gate line connected to a gate of the first select transistor in the memory string,
a third voltage is applied to a second select gate line connected to a gate of the second select transistor in the memory string,
a fourth voltage is applied to a third select gate line connected to a gate of third select transistor in the memory string,
a fifth voltage lower than the first voltage is applied to a fourth select gate line connected to a gate of the fourth select transistor in the memory string, and
a sixth voltage lower than the first, second, third, fourth and fifth voltages is applied to word lines connected to gates of memory cell transistors in the first portion of the memory string and word lines connected to gates of memory cell transistors in the second portion of the memory string.

15. The semiconductor storage device according to claim 14, wherein, during the first mode data erase, holes generated by gate induced drain leakage are supplied to the memory cell transistors from a source line side and a bit line side of the memory string.

16. The semiconductor storage device according to claim 14, wherein, during the second mode data erase, holes generated by gate induced drain leakage are supplied to the memory cell transistors from one of a source line side or a bit line side of the memory string, but not both.

17. The semiconductor storage device according to claim 14, wherein
a semiconductor doped with arsenic or phosphorus is used for a channel of the first select transistor, and
a semiconductor doped with boron is used for a channel of the second select transistor.

18. A memory cell array, comprising:
a semiconductor substrate;
a plurality of memory strings on the semiconductor substrate, each of the memory strings comprising first, second, third and fourth select transistors and first and second memory cells connected in series with each other in a first direction perpendicular to a surface of the semiconductor substrate, the first and fourth select transistors being at respective ends of the series connection;
first, second, third and fourth select gate lines connected to gates of the first, second, third and fourth select transistors, respectively;
first and second word lines connected to gates of the first and second memory cells, respectively;
a bit line connected to the first select transistor; and
a source line connected to the fourth select transistor, wherein
in a first mode of a data erase operation to erase both the first and second memory cells,
the bit line and the source line receive a first voltage higher than a power supply voltage;
the first select gate line receives a second voltage higher than the power supply voltage and lower than the first voltage;
the second select gate line receives a third voltage equal to the first voltage;
the third select gate line receives a fourth voltage equal to the first voltage;
the fourth select gate line receives a fifth voltage lower than the first voltage; and
the first and second word lines receive a sixth voltage lower than the first, second, third, fourth and fifth voltages.

19. The memory cell array according to claim 18, wherein, in a second mode of the data erase operation to erase the first memory cell but not the second memory cell,
the bit line and the source line receive the first voltage,
the first select gate line receives the second voltage,
the second select gate line receives the third voltage,
the third and fourth select gate lines receive the fourth voltage, and
the first word line receives the sixth voltage, and
the second word line is set to be in a floating state.

20. The memory cell array according to claim 19, wherein, in the second mode of the data erase operation to erase the second memory cell but not the first memory cell,
the bit line and the source line receive the first voltage,
the first and second select gate lines receive the third voltage,
the third select gate line receives the fourth voltage,
the fourth select gate line receives the fifth voltage,
the first word line is set to be in a floating state, and
the second word line receives the sixth voltage.

* * * * *